United States Patent
Chen et al.

(10) Patent No.: US 11,680,316 B2
(45) Date of Patent: Jun. 20, 2023

(54) DEPOSITION APPARATUS

(71) Applicant: Industrial Technology Research Institute, Hsinchu (TW)

(72) Inventors: Kuan-Chou Chen, Hsinchu (TW); Ching-Chiun Wang, Miaoli County (TW); Chih-Yung Huang, Hsinchu (TW); Muh-Wang Liang, Miaoli County (TW); Yi-Jiun Lin, Chiayi County (TW)

(73) Assignee: Industrial Technology Research Institute, Hsinchu (TW)

( * ) Notice: Subject to any disclaimer, the term of this patent is extended or adjusted under 35 U.S.C. 154(b) by 358 days.

(21) Appl. No.: 17/117,111

(22) Filed: Dec. 10, 2020

(65) Prior Publication Data

US 2022/0119943 A1    Apr. 21, 2022

(30) Foreign Application Priority Data

Oct. 21, 2020    (TW) .................. 109136561

(51) Int. Cl.
   *C23C 16/44*    (2006.01)
   *C23C 16/455*   (2006.01)
   *C23C 16/46*    (2006.01)

(52) U.S. Cl.
   CPC ...... *C23C 16/4401* (2013.01); *C23C 16/4558* (2013.01); *C23C 16/45504* (2013.01); *C23C 16/45517* (2013.01); *C23C 16/45519* (2013.01); *C23C 16/45591* (2013.01); *C23C 16/46* (2013.01)

(58) Field of Classification Search
   CPC .......... C23C 16/4401; C23C 16/45504; C23C 16/45517; C23C 16/45519;
   (Continued)

(56) References Cited

U.S. PATENT DOCUMENTS 5,322,567 A    6/1994   Deaton et al.
5,882,417 A *  3/1999   van de Ven .......... C23C 16/455
                                                      118/500
(Continued)

FOREIGN PATENT DOCUMENTS

CN    1910726       1/2011
CN    107614750     4/2020
(Continued)

OTHER PUBLICATIONS

"Office Action of Taiwan Counterpart Application", dated Jun. 8, 2021, p. 1-p. 5.
(Continued)

*Primary Examiner* — Jeffrie R Lund
(74) *Attorney, Agent, or Firm* — JCIPRNET (57) ABSTRACT

A deposition apparatus including a chamber having a deposition area and a non-deposition area, a gas intake device communicated with the chamber, a gas annulus disposed in the chamber and surrounding the gas intake device, a carrier disposed in the deposition area and a retaining annulus disposed in chamber and surrounding the carrier. The gas intake device is disposed corresponding to the deposition area and configured to draw a process gas into the deposition area. The gas annulus is configured to generate an annular gas curtain in the deposition area. The carrier carries a deposited object, wherein the gas annulus is located between the gas intake device and the carrier. The deposited object is surrounded by the annular gas curtain. The retaining annulus has a plurality of through holes. The retaining annulus is located between the gas annulus and the carrier.

16 Claims, 12 Drawing Sheets

(58) Field of Classification Search
CPC .......... C23C 16/4558; C23C 16/45591; C23C 16/46; C23C 16/4412; C23C 16/45502; C23C 16/455

See application file for complete search history.

(56) References Cited

U.S. PATENT DOCUMENTS

| | | | | |
|---|---|---|---|---|
| 6,059,885 | A * | 5/2000 | Ohashi | C23C 16/45574 |
| | | | | 118/730 |
| 6,096,135 | A * | 8/2000 | Guo | H01L 21/67109 |
| | | | | 118/728 |
| 6,500,300 | B2 * | 12/2002 | Donohoe | H01J 37/32642 |
| | | | | 156/345.43 |
| 6,537,422 | B2 * | 3/2003 | Sakuma | H01L 21/67103 |
| | | | | 118/724 |
| 6,709,523 | B1 * | 3/2004 | Toshima | H01L 21/67109 |
| | | | | 118/724 |
| 2008/0261074 | A1 | 10/2008 | Shishikura | |
| 2012/0103526 | A1 * | 5/2012 | Ouye | H01J 37/32495 |
| | | | | 205/172 |
| 2015/0252475 | A1 * | 9/2015 | Lin | C23C 16/45519 |
| | | | | 118/724 |
| 2022/0119943 | A1 * | 4/2022 | Chen | C23C 16/45504 |

FOREIGN PATENT DOCUMENTS

| | | | | |
|---|---|---|---|---|
| CN | 114381716 | A * | 4/2022 | ....... C23C 16/45504 |
| CN | 115011948 | A * | 9/2022 | |
| KR | 101477602 | B1 * | 12/2014 | |
| TW | 557473 | | 10/2003 | |
| TW | I494467 | | 8/2015 | |
| TW | 201539520 | | 10/2015 | |
| TW | 201700782 | | 1/2017 | |
| TW | 201806449 | | 2/2018 | |
| TW | I683363 | | 1/2020 | |
| WO | WO-2021223267 | A1 * | 11/2021 | ............... B08B 5/02 |

OTHER PUBLICATIONS

G.M. Burdick, et al., "Describing hydrodynamic particle removal from surfaces using the particle Reynolds number", Journal of Nanoparticle Research, May 19, 2001, pp. 455-467.

E.P. Visser, et al.,"Return Flows in Horizontal MOCVD Reactors Studied With the Use Of TiO2 Particle Injection and Numerical Calculations", Journal of Crystal Growth, Oct. 7, 1989, pp. 929-946.

Yuji Kurimoto, et al., "Fine particle removal by a negatively-charged fine particle collector in silane plasma", Thin Solid Films, Nov. 11, 2003, pp. 285-291.

Ning Zhou, et al., "CFD simulation of pulsed MOCVD to reduce gas-phase parasitic reaction", Proceedings of SPIE, Jul. 6, 1999, pp. 58-72.

D.G. Zhao, et al., "Parasitic reaction and its effect on the growth rate of AlN by metalorganic chemical vapor deposition", Journal of Crystal Growth, Jan. 9, 2006, pp. 72-75.

Derek Endres, et al., "Numerical investigation of pulsed chemical vapor deposition of aluminum nitride to reduce particle formation", Journal of Crystal Growth, Aug. 31, 2011, pp. 42-50.

* cited by examiner

DEPOSITION APPARATUS

CROSS-REFERENCE TO RELATED APPLICATION

This application claims the priority benefit of Taiwan application serial no. 109136561, filed on Oct. 21, 2020. The entirety of the above-mentioned patent application is hereby incorporated by reference herein and made a part of this specification.

BACKGROUND

Technical Field

The disclosure relates to a process apparatus, and particularly relates to a deposition apparatus.

Description of Related Art

Deposition technology is widely used in the semiconductor industry, optoelectronic industry, or other related industries. As far as the existing deposition apparatus is concerned, deposited object is carried by the carrier in the chamber, and gas is drawn into the chamber through the gas intake device. After the gas is drawn into the chamber, the gas is energized to be ionized, and the deposited object on the carrier is heated by the heating device, such that the ionized gas undergoes a chemical reaction in the chamber and deposits on the surface of the deposited object to form a thin film.

The by-products produced during the aforementioned chemical reaction, and the gas not participated in the reaction form particles of different sizes, which are extracted from the chamber by the gas extraction device. However, the existing deposition apparatus cannot effectively control the gasflow circulation path in the chamber, causing the aforementioned particles to drift and diffuse randomly in the chamber, which affects the quality and uniformity of the deposition.

SUMMARY

The present disclosure provides a deposition apparatus.

A deposition apparatus includes a chamber, a gas intake device, a gas annulus, a carrier, and a retaining annulus. The chamber includes a deposition area, and a non-deposited area located at a periphery of the deposition area. A gas intake device is communicated with the chamber, where the gas intake device is disposed corresponding to the deposition area of the chamber and is configured to draw a gas into the deposition area of the chamber. A gas annulus is disposed in the chamber, where the gas annulus surrounds the gas intake device and is configured to form an annular gas curtain in the deposition area. A carrier is disposed in the deposition area of the chamber, where the gas annulus is located between the gas intake device and the carrier, and the carrier is configured to carry a deposited object. The deposited object is surrounded by the annular gas curtain. A retaining annulus is disposed in the chamber and surrounds the carrier, where the retaining annulus is located between the gas annulus and the carrier and disposed along a boundary between the deposition area and the non-deposited area. The retaining annulus includes an inner wall surface facing the deposition area, an outer wall surface facing the non-deposited area, and multiple through holes, where the through holes penetrate through the inner wall surface and the outer wall surface.

In order to make the above-mentioned features of the present disclosure more obvious and understandable, the following specific embodiments are described in detail with the accompanying drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the exemplary embodiments of the disclosure, examples of which are illustrated in the accompanying drawings. Wherever possible, the same reference numbers are used in the drawings and the description to refer to the same or like parts.

Figure 1A:
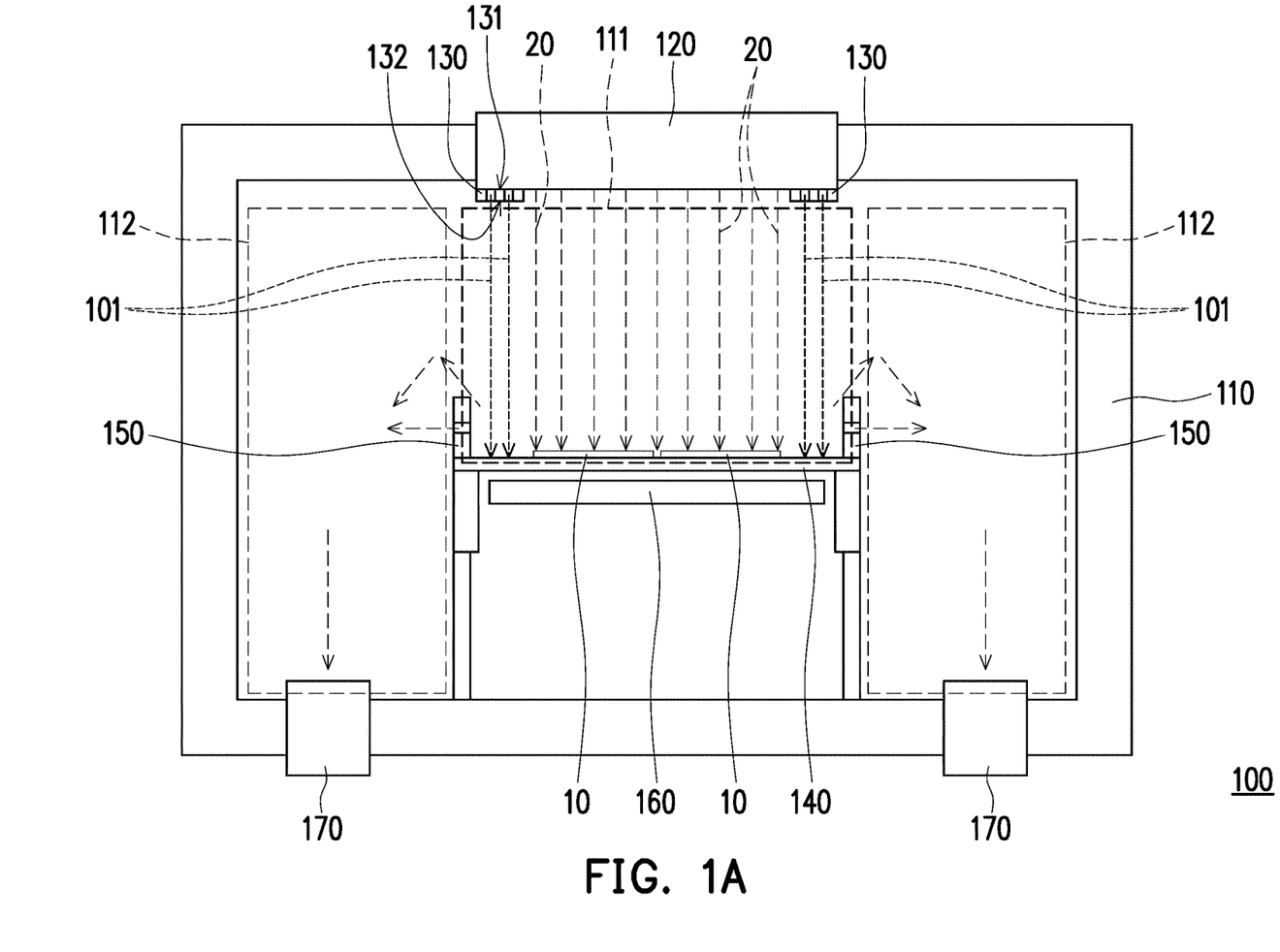
FIG. 1A is a schematic diagram of a deposition apparatus according to an embodiment of the disclosure.

FIG. 1A is a schematic diagram of a deposition apparatus according to an embodiment of the disclosure. Referring to FIG. 1A, in the present embodiment, a deposition apparatus 100 includes a chamber 110, a gas intake device 120, a gas annulus 130, a carrier 140, and a retaining annulus 150. The chamber 110 may be connected to a vacuum pump, and the vacuum pump may extract gas from the chamber 110, such that the chamber 110 may form a vacuum state. In detail, the chamber 110 has a deposition area 111, and a non-deposited area 112 located at a periphery of the deposition area 111. The gas intake device 120 is communicated with the chamber 110 and is disposed corresponding to the deposition area 111 of the chamber 110. On the other hand, the gas annulus 130 is disposed in the chamber 110. The gas annulus 130 surrounds the gas intake device 120 and may be a closed ring structure extending along the edge of the gas intake device 120.

The carrier 140 is disposed in the deposition area 111 of the chamber 110; the gas annulus 130 is located between the gas intake device 120 and the carrier 140, and the carrier 140 is configured to carry a deposited object 10. On the other hand, the retaining annulus 150 is disposed in the chamber 110 and surrounds the carrier 140. Furthermore, the retaining annulus 150 is located between the gas annulus 130 and the carrier 140, and the deposited object 10 is located in the retaining annulus 150. The retaining annulus 150 protrudes from an edge of the carrier 140 toward the gas annulus 130, and may be a closed ring structure extending along the edge of the carrier 140. For example, the retaining annulus 150 may be a rectangular ring structure, a circular ring structure, an oval ring structure, or a polygonal ring structure.

Figure 1B:
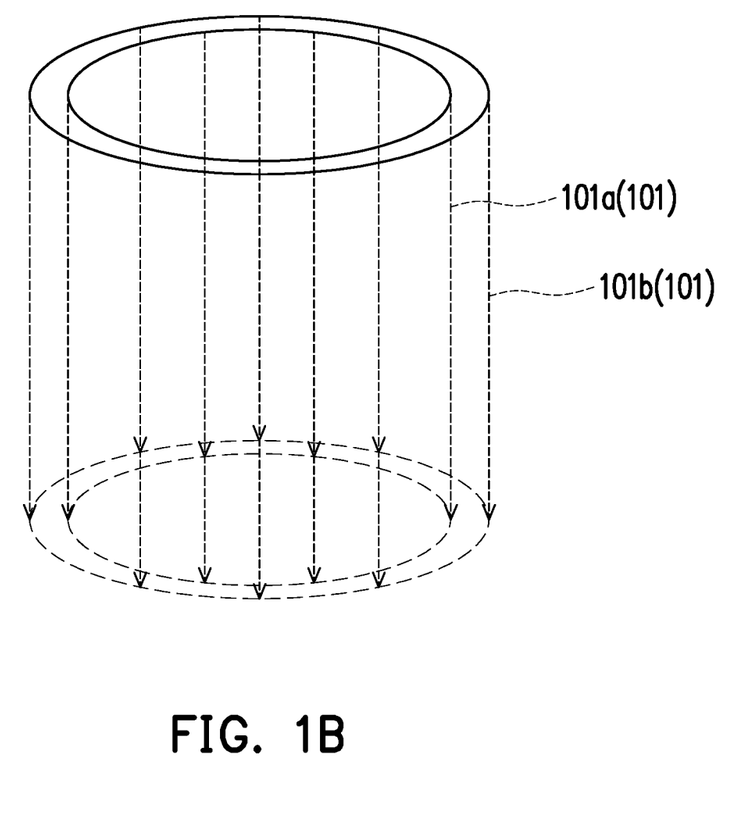
FIG. 1B is a schematic diagram of an annular gas curtain of FIG. 1A.

FIG. 1B is a schematic diagram of an annular gas curtain of FIG. 1A. Referring to 1A and 1B, in the present embodiment, the gas intake device 120 is configured to draw a process gas 20 into the deposition area 111 of the chamber 110 and blow gasflow toward the carrier 140. On the other hand, the gas annulus 130 blows the gasflow toward the carrier 140 to form an annular gas curtain 101 in the deposition area 111, resulting in a laminar boundary effect. In detail, the deposited object 10 is surrounded by the annular gas curtain 101, and the annular gas curtain 101 is adjacent to a boundary between the deposition area 111 and the non-deposited area 112. Therefore, the annular gas curtain 101 can prevent the process gas 20 from flowing out of the deposition area 111 to the non-deposited area 112, so as to increase the time that the process gas 20 stays in the deposition area 111 and the concentration of the process gas 20 in the deposition area 111, such that the process gas 20 fully undergoes a chemical reaction in the deposition area 111 and deposits on the surface of the deposited object 10 to form a thin film, so as to improve the quality and uniformity of the deposition.

On the other hand, in the aforementioned chemical reaction process, by-products, and the process gas 20 not participated in the reaction form particles of different sizes. Furthermore, the particles may be drawn by the gasflow to flow from the deposition area 111 to the non-deposited area 112, and the annular gas curtain 101 may be configured to prevent the particles located in the non-deposited area 112 from flowing back to the deposition area 111, thus preventing the particles from affecting the coating quality and uniformity and causing adverse effects.

The gas annulus 130 and the retaining annulus 150 are disposed between the gas intake device 120 and the carrier 140, the retaining annulus 150 is disposed along the boundary between the deposition area 111 and the non-deposited area 112, and extends along the boundary between the deposition area 111 and the non-deposited area 112. In detail, a position of an orthographic projection of the gas annulus 130 on the carrier 140 is also located inside the retaining annulus 150, and correspondingly, a position around the carrier 140 where the annular gas curtain 101 falls is also located inside the retaining annulus 150.

Figure 2A:
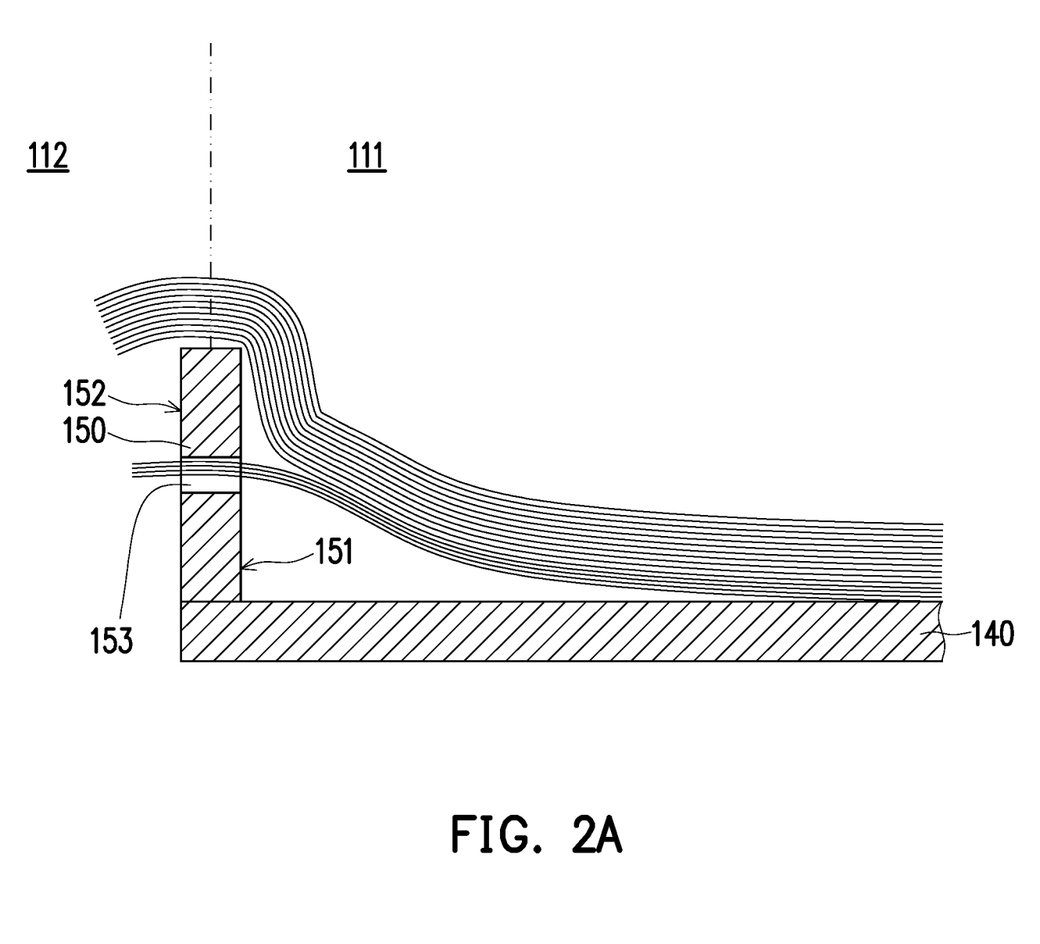
FIG. 2A is a partially enlarged schematic cross-segmental diagram of a flow field formed in a retaining annulus of FIG. 1A.
Figure 2B:
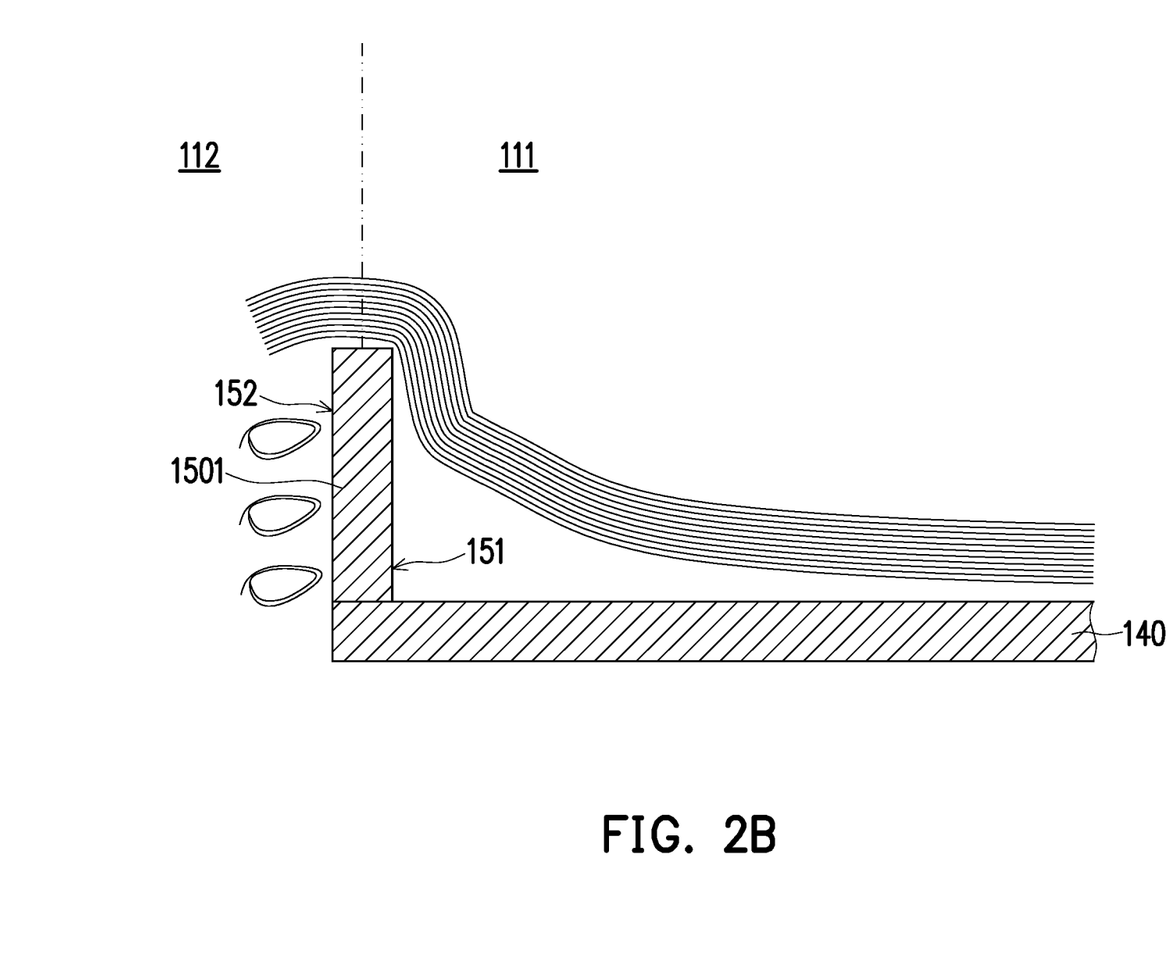
FIG. 2B is a schematic partial enlarged cross-segmental diagram of a flow field formed in a retaining annulus without through holes.

FIG. 2A is a partially enlarged schematic cross-segmental diagram of a flow field formed in a retaining annulus of FIG. 1A. FIG. 2B is a schematic partial enlarged cross-segmental diagram of a flow field formed in a retaining annulus without through holes. Referring to 1A and 2A, in the present embodiment, the retaining annulus 150 has an inner wall surface 151 facing the deposition area 111, an outer wall surface 152 facing the non-deposited area 112, and multiple through holes 153; the multiple through holes 153 penetrate through the inner wall surface 151 and the outer wall surface 152 and serve as drainage holes. After the gasflow reaches the carrier 140, part of the gasflow may flow from the deposition area 111 through above the retaining annulus 150, and then flow to the non-deposited area 112. At the same time, the other part of the gasflow may flow from the deposition area 111 through the multiple through holes 153 and then flow to the non-deposited area 112.

As shown in FIG. 2B, when a retaining annulus 1501 is not provided with multiple drainage holes communicated with the inner wall surface 151 and the outer wall surface 152, there is an excessive pressure difference between the inner wall surface 151 and the outer wall surface 152 of the retaining annulus 1501. Therefore, as shown in FIG. 2B, the gasflow flowing to the non-deposited area 112 forms a vortex or a turbulence on the outer wall surface 152 of the retaining annulus 1501, thereby affecting the circulation efficiency of the gasflow.

As shown in FIG. 2A, the retaining annulus 150 is provided with multiple drainage holes (through holes 153) communicated with the inner wall surface 151 and the outer wall surface 152, so as to balance the pressure difference between the inner wall surface 151 and the outer wall surface 152 of the retaining annulus 150, in order to eliminate the vortex or the turbulence formed on the outer wall surface 152 of the retaining annulus 150, and improve the circulation efficiency of the gasflow.

Please refer to FIG. 1A and FIG. 2A. In one embodiment, the inner wall surface 151 of the retaining annulus 150 is a rough surface; that is, the inner wall surface 151 has concaves and convexes or has been surface-roughened. In detail, some particles flowing with the gasflow flow from the deposition area 111 to the non-deposited area 112, while some other particles hit and adhere to the inner wall surface 151 of the retaining annulus 150, so the particles can be prevented from drifting and spreading randomly in the deposition area 111. Since the inner wall surface 151 of the retaining annulus 150 is a rough surface, an adhesion effect of the particles on the inner wall surface 151 of the retaining annulus 150 can be improved.

For example, on the ring structure of the retaining annulus 150, the multiple through holes 153 are arranged equidistantly, and the number is eight, but the present disclosure is not limited thereto.

Please refer to FIG. 1A. The deposition apparatus 100 further includes a heater 160 and a gas extraction device 170; the heater 160 is disposed below the deposition area 111 of the chamber 110, and the carrier 140 is disposed above the heater 160. The heater 160 is configured to heat the deposited object 10 on the carrier 140 and increase the temperature in the deposition area 111. The gas extraction device 170 is communicated with the chamber 110. The gas extraction device 170 is disposed corresponding to the non-deposited area 112 of the chamber 110, and is configured to extract the particles formed by the by-products and the process gas 20 not participated in the reaction from the chamber 110.

Figure 3A:
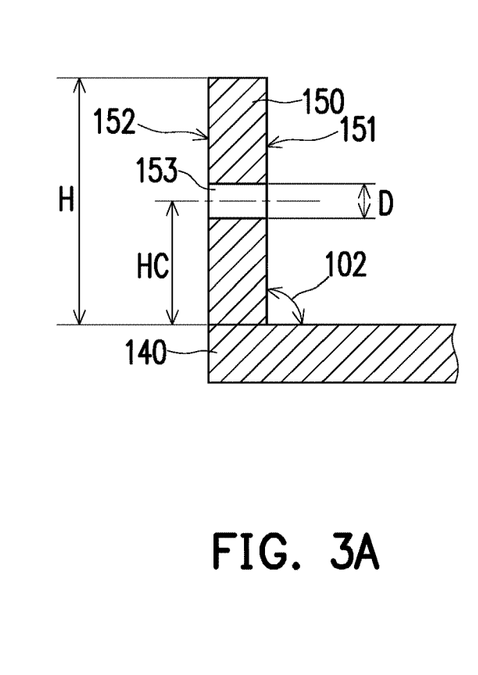
FIG. 3A is a schematic partial enlarged cross-segmental diagram of a retaining annulus and a carrier of FIG. 1A.
Figure 3B:
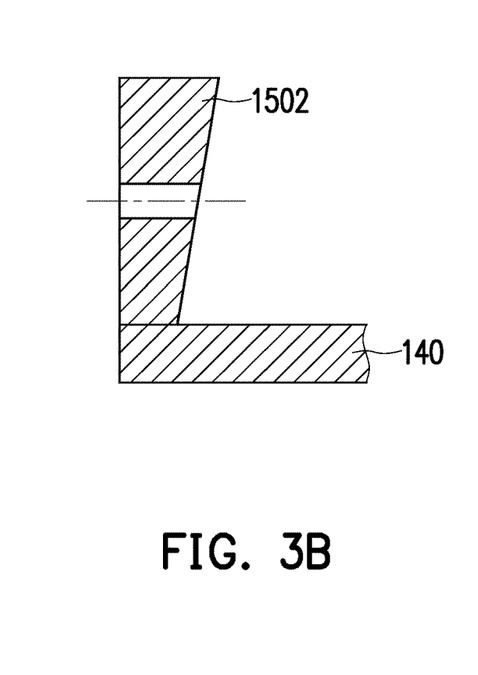
FIG. 3B to FIG. 3I are partial enlarged cross-segmental schematic diagrams of retaining annuluses and carriers in other embodiments.
Figure 3C:
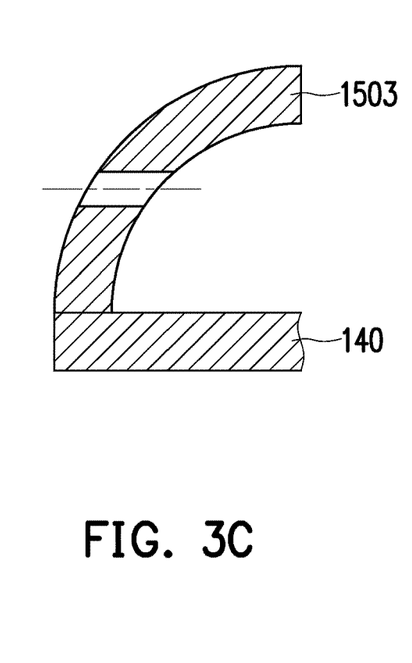

FIG. 3A is a schematic partial enlarged cross-segmental diagram of a retaining annulus and a carrier of FIG. 1A. Please refer to FIG. 3A. An angle 102 between the inner wall surface 151 of the retaining annulus 150 and the carrier plate 140 is between 60 and 90 degrees, so as to improve the adhesion effect of the particles on the inner wall surface 151. On the other hand, an aperture of the through hole 153 is D, and a height of retaining annulus 150 is H; the relationship between the two satisfies the following condition: $0.15 \leq D/H \leq 0.2$, in order to eliminate the vortex or the turbulence that may be formed on the outer wall surface 152 of the retaining annulus 150, and to improve the adhesion effect of the particles on the inner wall surface 151. In addition, a center height of the through hole 153 is HC and the height of retaining annulus 150 is H; the relationship between the two meets the following condition: $\frac{1}{3} \leq HC/H \leq \frac{1}{2}$, in order to eliminate the vortex or the turbulence that may be formed on the outer wall surface 152 of the retaining annulus 150, and to improve the adhesion effect of the particles on the inner wall surface 151.

For example, the retaining annulus 150 and the carrier 140 may be an integral structure, and may be made of graphite or other high thermal conductivity materials. In other embodiments, the retaining annulus is detachably installed on the carrier, so the removal and replacement may be performed depending on the wear condition of the retaining annulus.

FIG. 3B to FIG. 3I are partial enlarged cross-segmental schematic diagrams of retaining annuluses and carriers in other embodiments. Compared with the retaining annulus 150 shown in FIG. 3A, a retaining annulus 1502 shown in FIG. 3B has a trapezoidal structure. Compared with the retaining annulus 150 shown in FIG. 3A, a retaining annulus 1503 shown in FIG. 3C has an arc structure, and a concave arc of the retaining annulus 1503 faces the carrier 140.

Figure 3D:
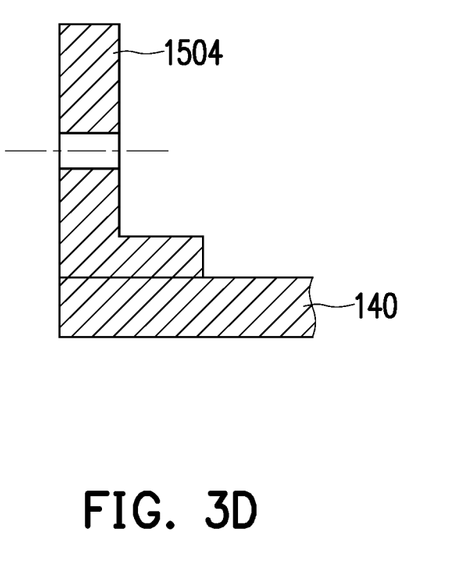
Figure 3E:
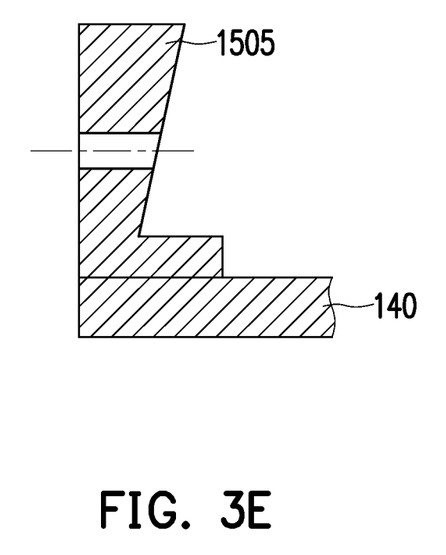
Figure 3F:
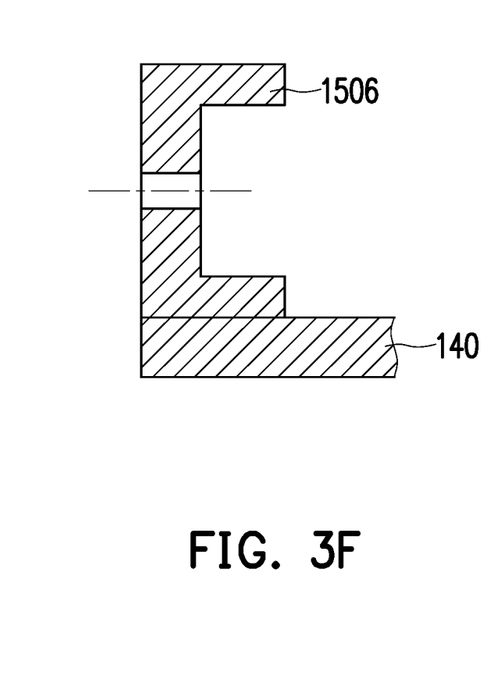

Compared with the retaining annulus 150 shown in FIG. 3A, a retaining annulus 1504 shown in FIG. 3D has an L-shaped structure. Compared with the retaining annulus 150 shown in FIG. 3A, a retaining annulus 1505 shown in FIG. 3E has an L-shaped structure, and a segment perpendicular to the carrier 140 is roughly trapezoidal. Compared with the retaining annulus 150 shown in FIG. 3A, a retaining annulus 1506 shown in FIG. 3F includes a first horizontal segment contacting the carrier 140, a vertical segment perpendicular to the first horizontal segment, and a second horizontal segment parallel to the first horizontal segment. The second horizontal segment is suspended above the carrier 140, and the first horizontal segment and the second horizontal segment are respectively connected to two ends of the vertical segment.

Figure 3G:
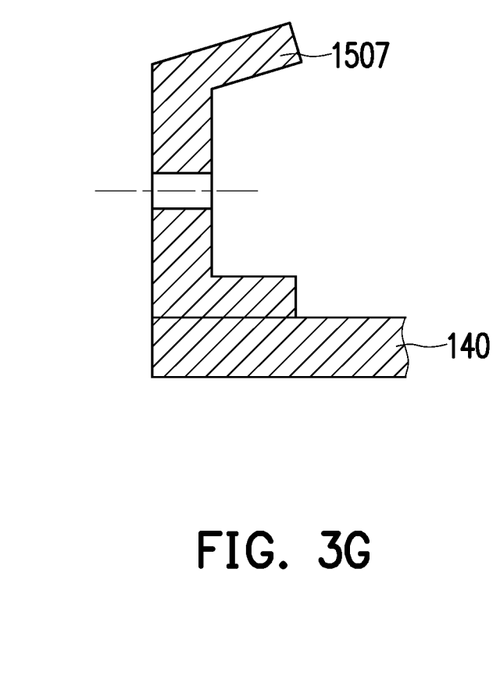
Figure 3H:
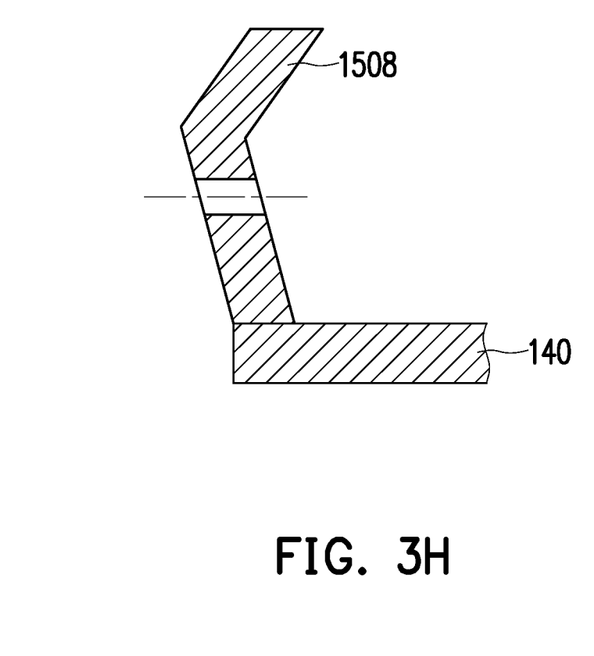
Figure 3I:
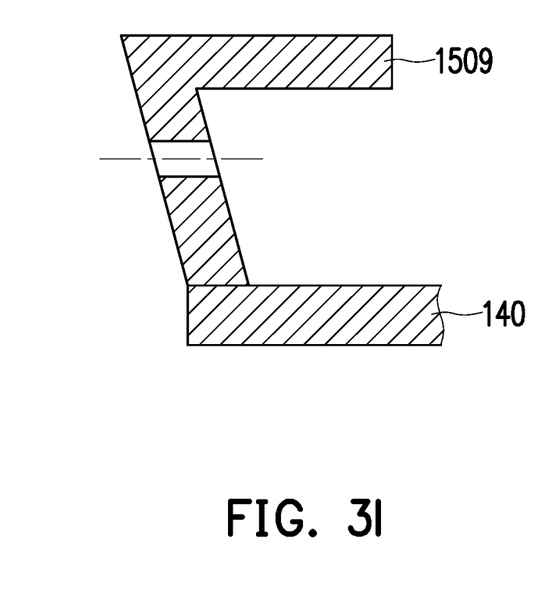

Compared with the retaining annulus 150 shown in FIG. 3A, a retaining annulus 1507 shown in FIG. 3G includes a horizontal segment contacting the carrier 140, a vertical segment perpendicular to the horizontal segment, and an inclined segment suspended above the carrier 140. The horizontal segment and the inclined segment are respectively connected to two ends of the vertical segment, and an angle between the inclined segment and the vertical segment is an obtuse angle. Compared with the retaining annulus 150 shown in FIG. 3A, a retaining annulus 1508 shown in FIG. 3H includes a first inclined segment contacting the carrier 140 and a second inclined segment connected to the first inclined segment. The second inclined segment is suspended above the carrier 140, and an angle between the first inclined segment and the second inclined segment is an obtuse angle. Compared with the retaining annulus 150 shown in FIG. 3A, a retaining annulus 1509 shown in FIG. 3I includes an inclined segment contacting the carrier 140 and a horizontal segment connected to the inclined segment. The horizontal segment is suspended above the carrier 140, and an angle between the inclined segment and the horizontal segment is an acute angle.

Figure 4A:
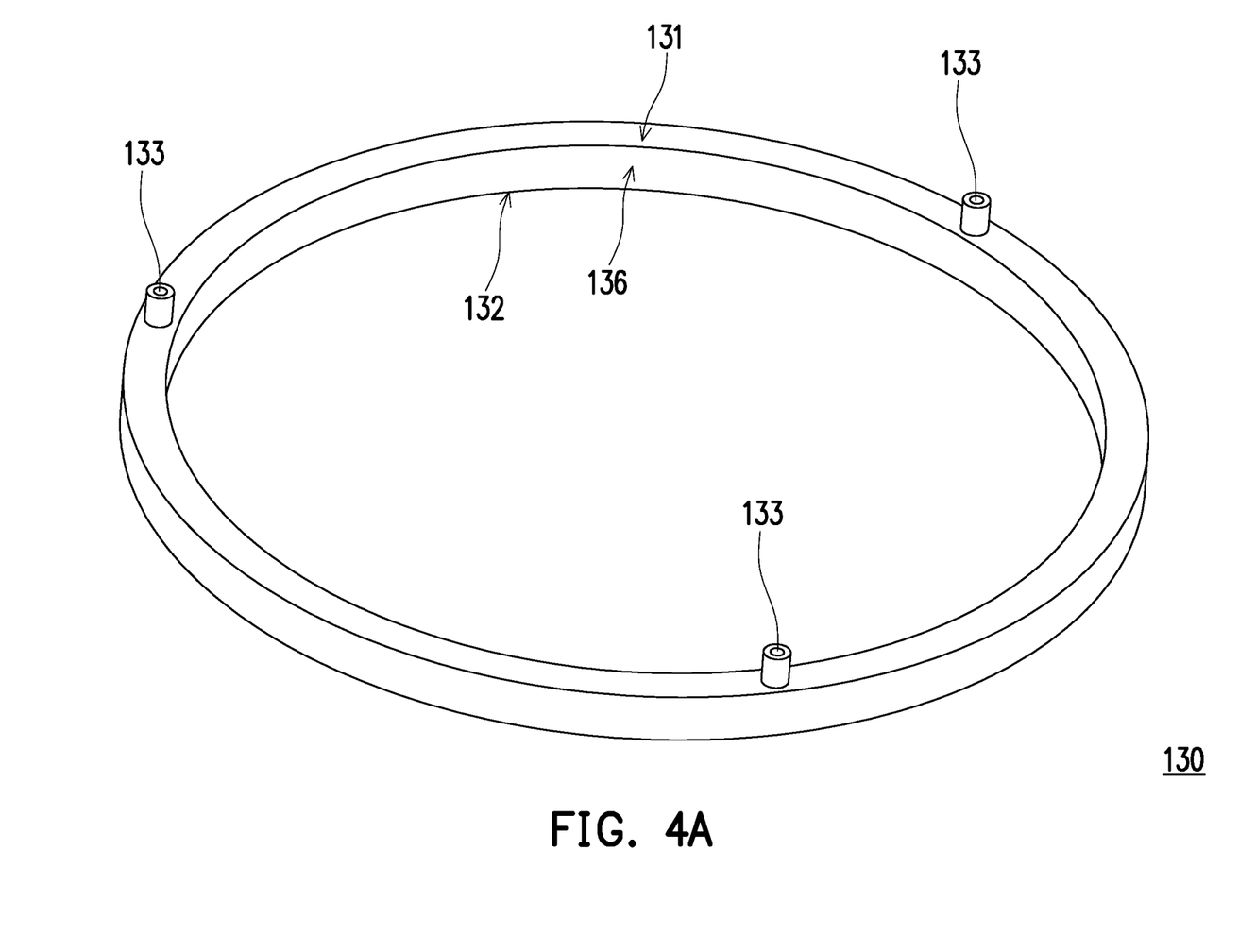
FIG. 4A and FIG. 4B are schematic diagrams of gas annulus of FIG. 1A from two different perspectives.
Figure 4B:
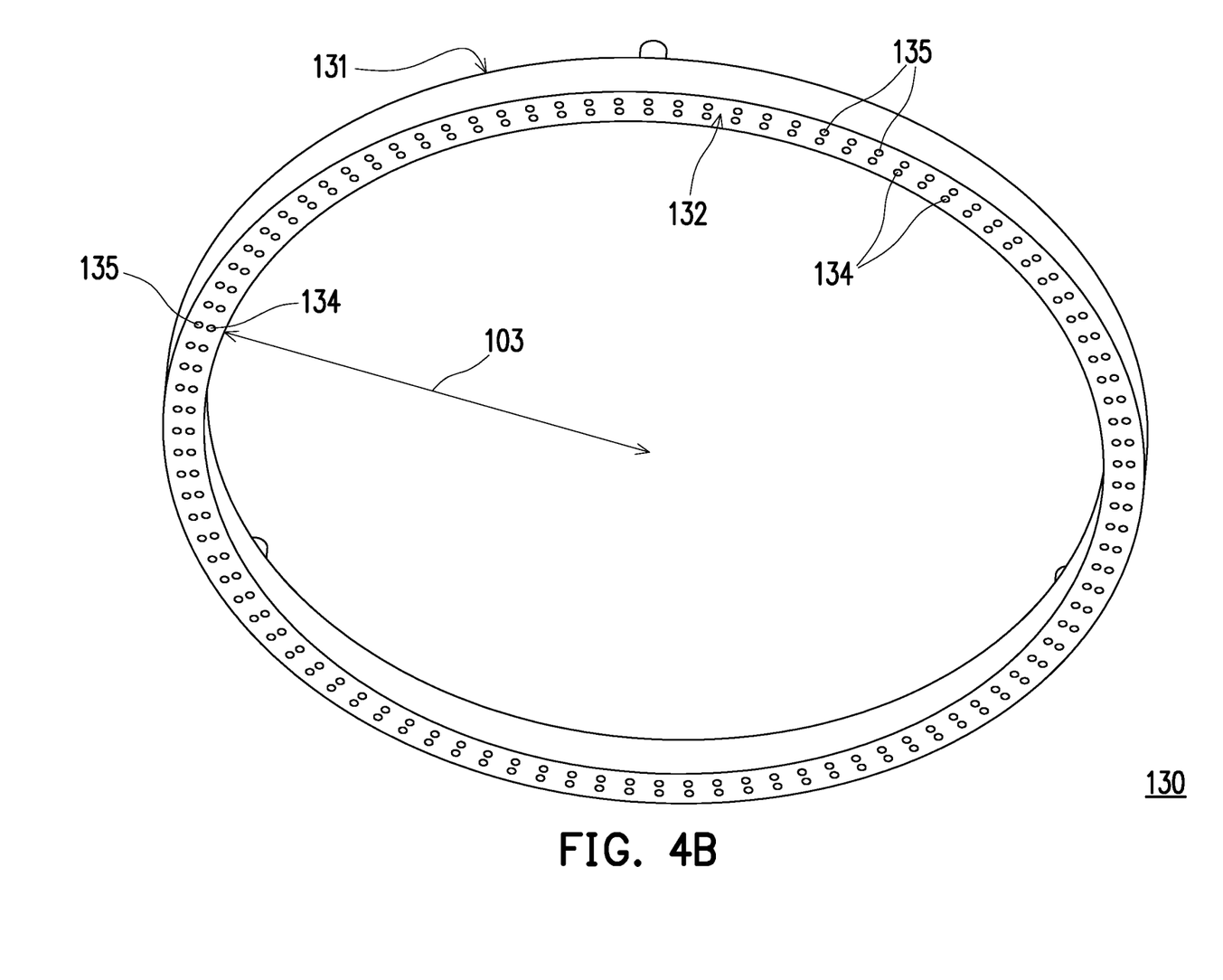

FIG. 4A and FIG. 4B are schematic diagrams of gas annulus of FIG. 1A from two different perspectives. Please refer to FIG. 1A, FIG. 4A and FIG. 4B. In the present embodiment, the gas annulus 130 has a top surface 131, a bottom surface 132, multiple gas inlets 133 located at the top surface 131, multiple first gas outlets 134 located at the bottom surface 132, and multiple second gas outlets 135 located at the bottom surface 132. The top surface 131 faces the gas intake device 120, and the bottom surface 132 faces the carrier 140. In the present embodiment, there are three gas inlets 133, and the three gas inlets 133 are arranged equidistantly at the top surface 131, but this disclosure does not limit the number of the gas inlets 133. In addition, in other embodiments, the three gas inlets 133 may be arranged at the top surface 131 at unequal distances. For example, the gas inlets 133 may be round holes, elliptical holes, elongated holes, polygonal holes, irregular holes, slots, or arc grooves. In other embodiments, the gas inlets may be annular grooves extending along the top surface of the gas annulus.

Further, the multiple gas inlets 133 are communicated with the multiple first gas outlets 134 and the multiple second gas outlets 135 through internal flow passages of the gas ring 130.

The gasflow flowing out from the multiple first gas outlets 134 and the multiple second gas outlets 135 forms the annular gas curtain 101. For example, the first gas outlets 134 and the second gas outlets 135 may be round holes, elliptical holes, elongated holes, polygonal holes, irregular holes, slots or arc-shaped slots. In other embodiments, the first gas outlets and the second gas outlets may be annular grooves extending along a bottom surface of the gas annulus.

Please refer to FIG. 1A, FIG. 1B, and FIG. 4B. The multiple first gas outlets 134 are arranged at an inner ring. The gasflow flowing out from the multiple first gas outlets 134 arranged at the inner ring forms a first annular gas curtain 101a. The multiple second gas outlets 135 are arranged at an outer ring. The gasflow flowing out from multiple second gas outlets 135 arranged at the outer ring forms a second annular gas curtain 101b. On a radial direction 103, any first gas outlet 134 arranged at the inner ring is aligned with a second gas outlet 135 arranged at the outer ring.

Referring to FIG. 4A, the gas annulus 130 also has an inner surface 136 connecting the top surface 131 and the bottom surface 132. In one embodiment, the inner surface 136 is a rough surface; that is, the inner surface 136 has concaves and convexes or has been surface-roughened. Since the inner surface 136 of the gas annulus 130 is a rough surface, the adhesion effect of the particles on the inner surface 136 of the gas annulus 130 can be improved. The gas annulus 130 may be provided with foam material or porous material, for example.

Figure 5:
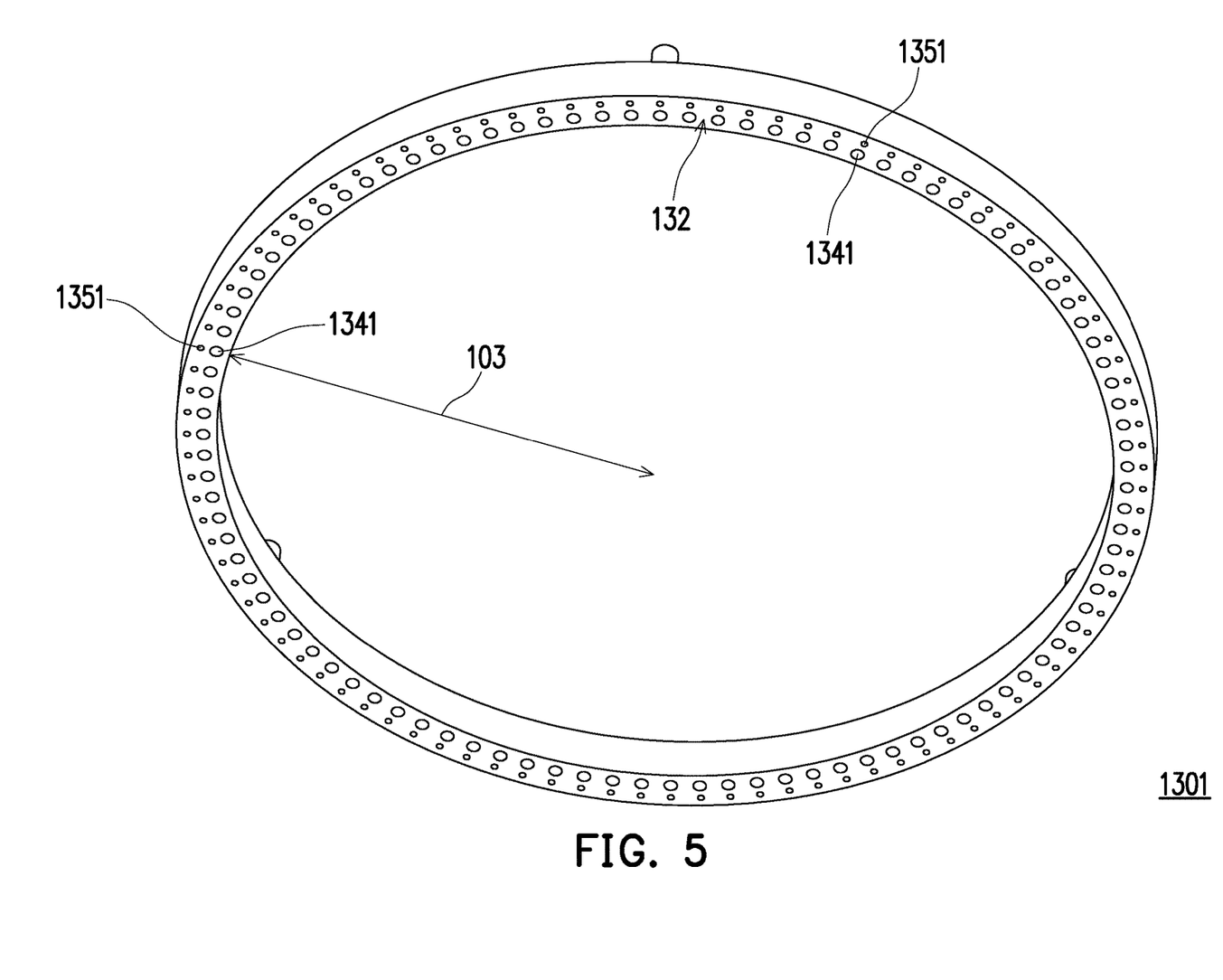
FIG. 5 is a schematic diagram of a gas annulus according to another embodiment of the disclosure.

FIG. 5 is a schematic diagram of a gas annulus according to another embodiment of the disclosure. Please refer to FIG. 5. The gas annulus 1301 of the present embodiment, an aperture of any first gas outlet 1341 arranged at the inner ring is larger than an aperture of any second gas outlet 1351 arranged at the outer ring. Therefore, a flow rate of the gasflow flowing from the multiple second gas outlets 1351 arranged at the outer ring is larger than a flow rate of the gasflow flowing from the multiple first gas outlets 1341 arranged at the inner ring, so as to prevent the process gas 20 from flowing out of the deposition area, or to prevent the particles from flowing back from the non-deposition area.

Figure 6:
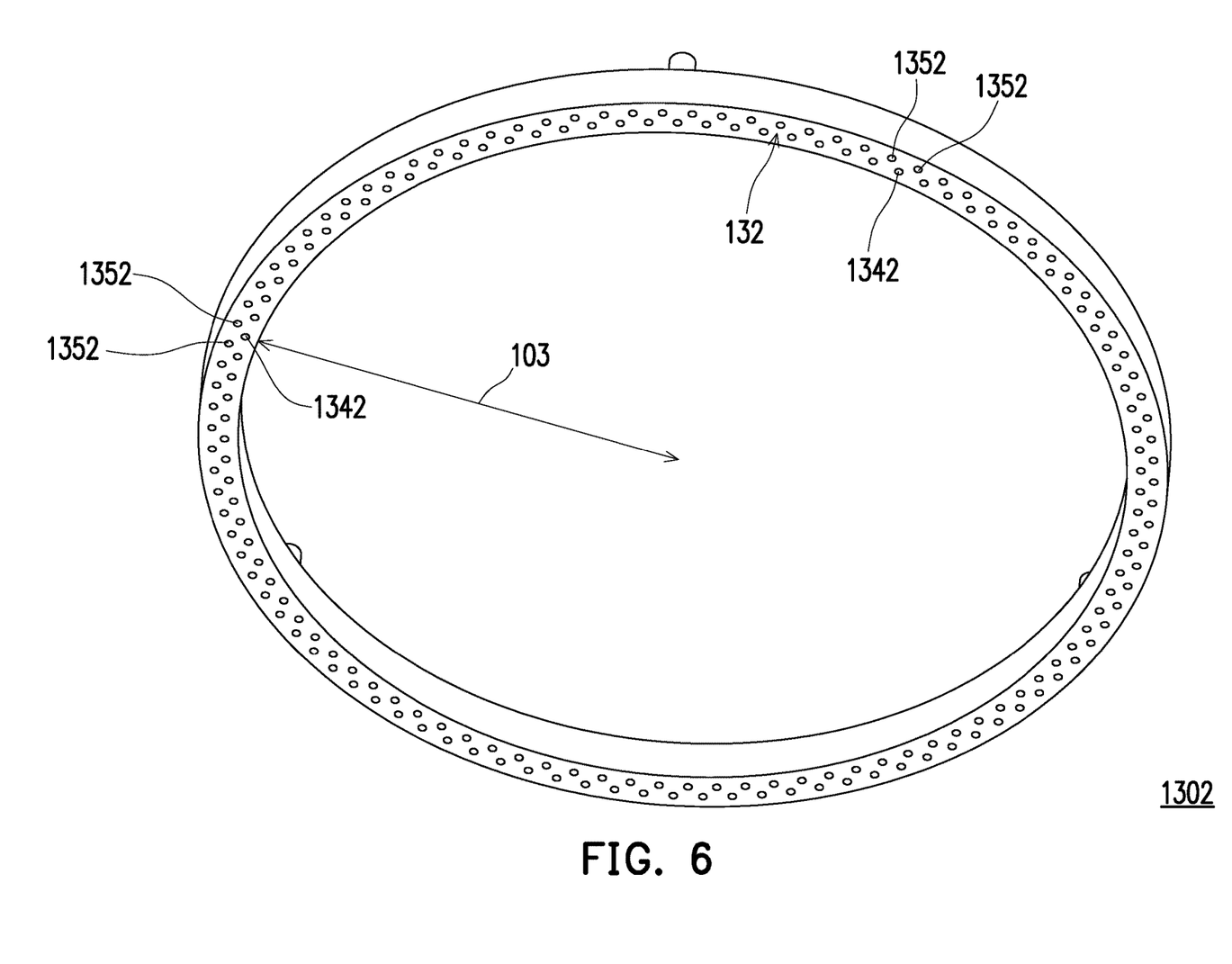
FIG. 6 is a schematic diagram of a gas annulus according to another embodiment of the disclosure.

FIG. 6 is a schematic diagram of a gas annulus according to another embodiment of the disclosure. Please refer to FIG. 6. The gas annulus 1302 of the present embodiment, on the radial direction 103, the first gas outlet 1342 arranged at the inner ring is located between the two adjacent second gas outlets 1352 arranged at the outer ring. In other words, the multiple first gas outlets 1342 arranged at the inner ring are staggered from the multiple second gas outlets 1352 arranged at the outer ring.

In summary, the deposition apparatus disclosed in the present disclosure forms the annular gas curtain in the deposition area, where the deposited object is surrounded by the annular gas curtain, and the annular gas curtain is adjacent to the boundary between the deposition area and the non-deposited area. Therefore, the annular gas curtain can prevent the gas from flowing out of the deposition area to the non-deposited area, so as to increase the time that the gas stays in the deposition area and the concentration of the gas in the deposition area, such that the gas fully undergoes a chemical reaction in the deposition area and deposits on the surface of the deposited object to form the thin film to improve the quality and uniformity of the deposition. On the other hand, in the aforementioned chemical reaction process, by-products, and the gas not participated in the reaction formed particles of different sizes. Furthermore, the particles can be drawn by the gasflow to flow from the deposition area to the non-deposited area, and the annular gas curtain may be configured to prevent the particles located in the non-deposited area from flowing back to the deposition area, thus preventing the particles from affecting the coating quality and uniformity and causing adverse effects.

The deposited object is carried by the carrier. An edge of the carrier is equipped with the retaining annulus, and the position where the annular gas curtain falls on the carrier is located inside the retaining annulus. Because of the collocation of the annular gas curtain and the retaining annulus, the time that the gas stays in the deposition area and the concentration of the gas in the deposition area can be significantly increased. On the other hand, the retaining annulus has multiple drainage holes (i.e. multiple through holes) to balance the pressure difference between the inside and the outside of the retaining annulus to eliminate the vortex or turbulence formed outside the retaining annulus and to improve the circulation efficiency of the gasflow. In addition, the retaining annulus may be configured for particles to adhere to it, so as to prevent particles from drifting and spreading in the deposition area.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A deposition apparatus, comprising:
    a chamber, comprising a deposition area, and a non-deposited area located at a periphery of the deposition area;
    a gas intake device, communicated with the chamber, wherein the gas intake device is disposed corresponding to the deposition area of the chamber and is configured to draw a process gas into the deposition area of the chamber;
    a gas annulus, disposed in the chamber, wherein the gas annulus surrounds the gas intake device and is configured to form an annular gas curtain in the deposition area;
    a carrier, disposed in the deposition area of the chamber, wherein the gas annulus is located between the gas intake device and the carrier, the carrier is configured to carry a deposited object, and the deposited object is surrounded by the annular gas curtain; and
    a retaining annulus, disposed in the chamber and surrounds the carrier, wherein the retaining annulus is located between the gas annulus and the carrier and disposed along a boundary between the deposition area and the non-deposited area, wherein the retaining annulus comprises an inner wall surface facing the deposition area, an outer wall surface facing the non-deposited area, and a plurality of through holes, wherein the through holes penetrate through the inner wall surface and the outer wall surface.

2. The deposition apparatus according to claim 1, wherein a position of an orthographic projection of the gas annulus on the carrier is located inside the retaining annulus.

3. The deposition apparatus according to claim 1, wherein a position around the carrier in which the annular gas curtain falls is located inside the retaining annulus.

4. The deposition apparatus according to claim 1, further comprising:
    a heater, disposed below the deposition area of the chamber, wherein the carrier is disposed above the heater.

5. The deposition apparatus according to claim 1, further comprising:
    a gas extraction device, communicated with the chamber, wherein the gas extraction device is disposed corresponding to the non-deposited area of the chamber.

6. The deposition apparatus according to claim 1, wherein the gas annulus comprises a top surface, a bottom surface, a plurality of gas inlets located at the top surface, and a plurality of gas outlets located at the bottom surface, wherein the gas outlets are communicated with the gas inlets.

7. The deposition apparatus according to claim 6, wherein parts of the gas outlets are arranged at an inner ring, and other parts of the gas outlets are arranged at an outer ring, wherein on a radial direction, any of the gas outlets arranged at the inner ring is aligned with one of the gas outlets arranged at the outer ring.

8. The deposition apparatus according to claim 6, wherein parts of the gas outlets are arranged at an inner ring, and other parts of the gas outlets are arranged at an outer ring, wherein on a radial direction, any of the gas outlets arranged at the inner ring is located between any two adjacent ones of the gas outlets arranged at the outer ring.

9. The deposition apparatus according to claim 6, wherein parts of the gas outlets are arranged at an inner ring, and other parts of the gas outlets are arranged at an outer ring, wherein an aperture of any of the gas outlets arranged at the inner ring is larger than an aperture of any of the gas outlets arranged at the outer ring.

10. The deposition apparatus according to claim 6, wherein the gas inlets are arranged equidistantly at the top surface.

11. The deposition apparatus according to claim 6, wherein the gas annulus further comprises an inner surface connecting the top surface and the bottom surface, and the inner surface is a rough surface.

12. The deposition apparatus according to claim 1, wherein the inner wall surface of the retaining annulus is a rough surface.

13. The deposition apparatus according to claim 1, wherein an aperture of any of the through hole is D, and a height of the retaining annulus is H, and $0.15 \leq D/H \leq 0.2$.

14. The deposition apparatus according to claim 1, wherein an angle between the inner wall surface and the carrier is between 60 and 90 degrees.

15. The deposition apparatus according to claim 1, wherein a center height of any of the through hole is HC, and a height of the retaining annulus is H, and $\frac{1}{3} \leq HC/H \leq \frac{1}{2}$.

16. The deposition apparatus according to claim 1, wherein the retaining annulus protrudes from an edge of the carrier.

* * * * *